(12) United States Patent
Chung et al.

(10) Patent No.: US 11,802,916 B2
(45) Date of Patent: Oct. 31, 2023

(54) APPARATUS AND METHOD FOR CHARACTERIZING AND MANAGING STACKED ENERGY STORAGE CELLS

(71) Applicant: ReJoule Incorporated, Signal Hill, CA (US)

(72) Inventors: Steven Chung, Stanton, CA (US); Kenny Huynh, Stanton, CA (US); Russell Okamura, Stanton, CA (US)

(73) Assignee: REJOULE INCORPORATED, Signal Hill, CA (US)

( * ) Notice: Subject to any disclaimer, the term of this patent is extended or adjusted under 35 U.S.C. 154(b) by 0 days.

(21) Appl. No.: 17/313,020

(22) Filed: May 6, 2021

(65) Prior Publication Data

US 2021/0333328 A1    Oct. 28, 2021

Related U.S. Application Data

(63) Continuation-in-part of application No. PCT/US2019/068863, filed on Dec. 30, 2019.

(60) Provisional application No. 62/788,665, filed on Jan. 4, 2019.

(51) Int. Cl.
| | |
|---|---|
| *G01R 31/30* | (2006.01) |
| *G01R 31/385* | (2019.01) |
| *G01R 31/3842* | (2019.01) |
| *G01R 31/364* | (2019.01) |
| *H01M 10/48* | (2006.01) |
| *G01R 31/392* | (2019.01) |

(52) U.S. Cl.
CPC ......... *G01R 31/386* (2019.01); *G01R 31/364* (2019.01); *G01R 31/3842* (2019.01); *H01M 10/482* (2013.01); *G01R 31/392* (2019.01)

(58) Field of Classification Search
None
See application file for complete search history.

(56) References Cited

U.S. PATENT DOCUMENTS

| | | | | |
|---|---|---|---|---|
| 2013/0234671 A1* | 9/2013 | Choi | ...................... | H02J 7/0016 320/128 |
| 2017/0098940 A1* | 4/2017 | Syouda | ................. | H02J 7/0019 |

* cited by examiner

*Primary Examiner* — Jas A Sanghera
(74) *Attorney, Agent, or Firm* — Snell & Wilmer LLP

(57) ABSTRACT

An electrochemical storage diagnostic system is configured to perform an electrical test to measure energy storage device parameters. The diagnostic system includes a charge management controller, electrically coupled to a power multiplexer, a power converter circuit, and an isolated converter circuit. The charge management controller is programmed with instructions to identify a device under test, selected from at least one member of the plurality of energy storage devices to perform an electrical test. Then, adjust a charge in the secondary energy storage device to a target voltage through the power multiplexer by transferring energy between the secondary energy storage device and a support device, selected from at least one member of the plurality energy storage devices. After that, transfer electrical power through the power multiplexer and power converter circuit to the device under test in order to perform the electrical test. Finally, complete the electrical test.

14 Claims, 9 Drawing Sheets

APPARATUS AND METHOD FOR CHARACTERIZING AND MANAGING STACKED ENERGY STORAGE CELLS

RELATED APPLICATION

This application is a continuation-in-part of International Application PCT/US/2019/068863 filed on Dec. 30, 2019 ("the '863 application).

The '863 application claims priority to provisional patent application U.S. Ser. No. 62/788,665 filed on Jan. 4, 2019 ("the '665 application").

The entire contents of the '863 application and the '665 application is herein incorporated by reference.

FEDERALLY SPONSORED RESEARCH OR DEVELOPMENT

The invention was made with government support under grants 1842957 and 2026198 awarded by the National Science Foundation. The government has certain rights in the invention.

BACKGROUND

The embodiments herein relate generally to the circuits and management methods for series connected energy storage cells in a module or pack, and for multiple groups of series connected energy storage cells in a group of modules or in a group of packs, herein referred to as energy storage devices. System management includes energy storage device diagnostics, energy storage device balancing, and other uses for charging or discharging energy storage devices in an electrochemical storage system. Energy storage device characterization includes determination of dc resistance, complex impedance, capacity, or other parameters of a cell, module, and/or pack (also referred to as electrochemical cell, module and/or pack, and/or battery cell, module and/or pack) by the use of Electrochemical Impedance Spectroscopy (EIS), dc pulse testing, hybrid pulse power characterization (HPPC), or other test method that requires injecting a signal into an energy storage device or group of energy storage devices.

Prior to embodiments of the disclosed invention, extensive hardware and complexity would be required to characterize individual cells in a system composed of multiple series connected energy storage devices, multiple parallel connected energy storage devices, and multiple series and parallel connected energy storage devices, and to perform fast active balancing. Prior embodiments may also subject the energy storage devices to nonideal conditions. Embodiments of the disclosed invention solve this problem

SUMMARY

The present invention seeks to provide a solution to this problem(s) by providing a system that enables series cell characterization and balancing capability. To characterize an electrochemical cell using a conventional method and system, a perturbation signal is injected into a device under test (DUT), and a subsequent response signal is measured. Cell characteristics such as impedance or internal resistance of the DUT are derived from the measured response signals. The system in the present invention allows for dynamic selection of an electrochemical storage cell within a series stacked energy storage system in a manner that reduces the number of complex perturbation and measurement circuits.

In an embodiment, the system comprises of a power multiplexer electrically coupled to a plurality of electrochemical cells connected in a series or parallel configuration, a power converter circuit, a measurement circuit, an isolated power converter circuit, a secondary energy storage device, and a charge management controller that controls the energy and power flow in the system and manages the mode of operation of the system. An electrical test comprises of the following steps: select a target cell or group of cells within a plurality of cells using the power circuit multiplexer, inject a perturbation current signal using the power conversion circuit, measure the response waveform voltage response, and determine the complex impedance of the cell through post-processing either on chip or in off-board post-processing. The system may loop through these steps for any such desired frequency range, perturbation current level, or number of iterations as necessary to measure for the desired impedance spectra, dc internal resistance, or other desired parameter, and may repeat as needed within the plurality of electrochemical cells of the module/pack.

BRIEF DESCRIPTION OF THE FIGURES

The detailed description of some embodiments of the invention is made below with reference to the accompanying figures.

DETAILED DESCRIPTION OF CERTAIN EMBODIMENTS

Figure 1:
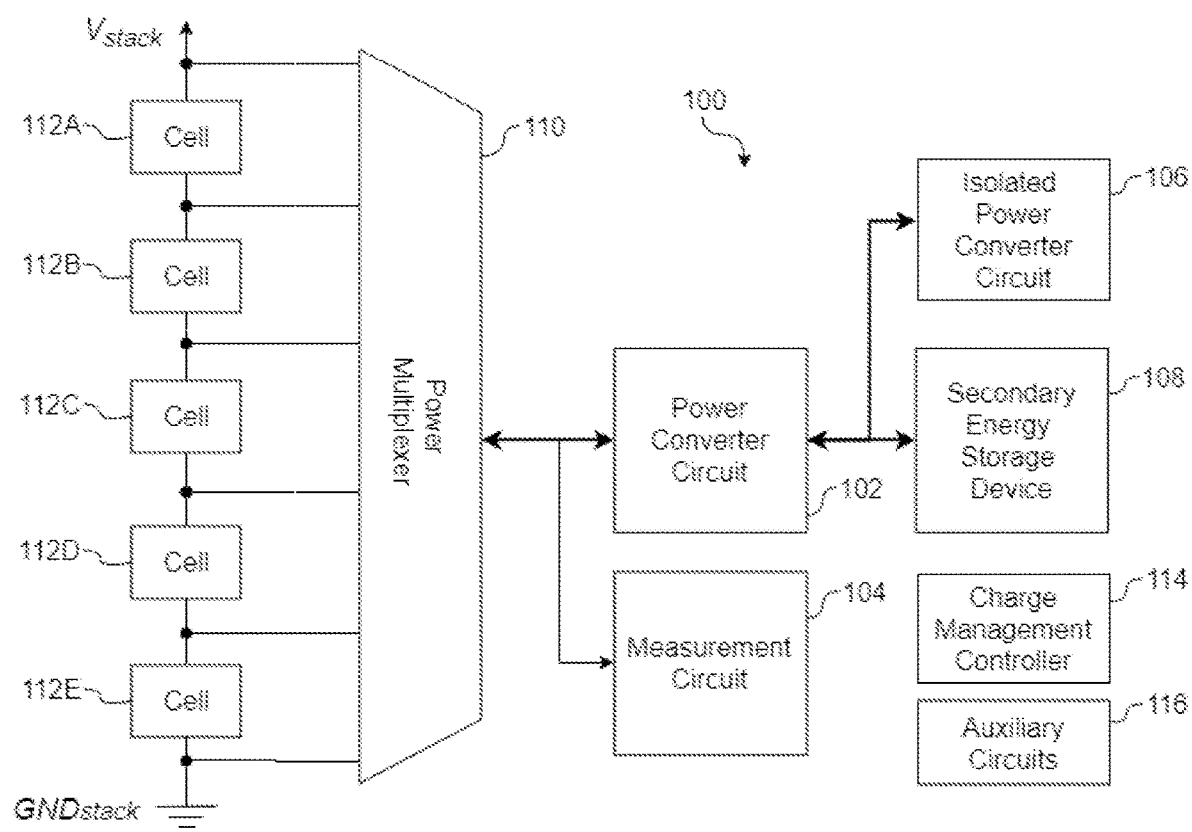
FIG. 1 illustrates an embodiment of the system hardware architecture.

A dual electrochemical cell characterization system and active balancing system is developed for electrochemical storage applications for the purpose of system performance improvement, size reduction, and cost reduction. The primary challenge addressed is to perform cell diagnostic techniques such as electrochemical impedance spectroscopy (EIS), direct-current (dc) pulse testing, hybrid pulse power characterization (HPPC), or other such characterization techniques for a plurality of electrochemical cells connected in a series configuration with minimum hardware complexity and cost, and to inject a precise perturbation signals to the electrochemical cells over a wide frequency range. Electrochemical cells include but are not limited to batteries of various chemistries including nickel-metal-hydride, lead-acid, nickel-cadmium, lithium-ion, lithium-iron-phosphate, lithium-sulphur, lithium-metal, and lithium-polymer. Electrochemical cells may also include other storage technologies including but not limited to fuel cells, ultracapacitors or supercapacitors, and other such electrochemical energy storage devices. Tracking electrochemical battery cell parameters such as dc internal resistance (DCIR, IR, or equivalent series resistance ESR) and cell impedance ($Z_{cell}$) can reveal a wealth of knowledge about degradation, aging, and cycling effects of batteries. A multi-port power system is proposed that is based on power electronics switch mode power supplies. The multi-port power system is able to perform various cell diagnostic techniques as well as cell-by-cell balancing control on series cells of electrochemical modules/packs. The various diagnostic techniques dc pulse testing, EIS, and HPPC are nondestructive diagnostic techniques that involve injecting an electrical voltage or current perturbation signal into a target device, and measuring the resulting current or voltage response signal, respectively. In electrochemical storage technology, these cell diagnostic techniques are used to characterize the electrochemical cells, to evaluate state-of-charge (SOC), to evaluate the electrochemical cell state-of-health (SOH) to track effects of transport kinetics in the cells, to assess a cell's internal temperature, and many more. Besides cell diagnostics, the system can be used for active balancing and internal cell-heating for electrochemical storage systems.

Electrochemical energy storage packs are typically comprised of a plurality of electrochemical energy storage cells connected together in parallel configurations, series configurations, or a hybrid combination of parallel and series configurations in order to meet an energy storage system's voltage, power, and energy requirements. For instance, one particular automotive battery pack may be a 96S2P configuration, meaning 96 cells are electrically connected in series and 2 cells are electrically connected in parallel. Another such battery pack may be a 48S20P configuration, which has 48 cells in series and 20 cells in parallel. In any energy storage or energy generation system with a plurality of cells, individual cells may behave and perform differently. In an embodiment of a battery pack, battery cells could perform differently with aging, and a balancing circuit is required to smooth performance between weak and stronger cells. These include embodiments where individual cells are electrically connected together in series. In embodiments with plurality of cells electrically connected in both series and parallel, each parallel group may be considered a single 'cell', and the system measures the average of the parameters of the plurality of parallel cells.

Online characterization techniques are often used to determine the relative state of an electrochemical cell, module, or pack, and include passive and active techniques. In passive techniques, a device under test (DUT) is monitored without any disturbances. The following parameters are possible to be monitored: the cell voltages, currents, temperatures, pressure, and other such measurements. In active characterization techniques, a perturbation is applied to the DUT in some fashion, and the response to that DUT perturbation is measured. Disturbances may include but are not limited to: electrical disturbances such as voltage or current, temperature, pressure, etc. The active characterization techniques that use electrical disturbances can be further categorized into dc pulse disturbances, bidirectional dc pulse disturbances, often referred to as hybrid-pulse power characterization or HPPC, and alternative current (ac) disturbances where varying electrical signals are injected into the DUT. The use of bidirectional dc pulse disturbance and HPPC will be used interchangeably. These active characterization techniques will be termed as electrical tests throughout this document.

To perform a dc pulse electrical test, a dc current is injected into the DUT, and a resulting voltage response is measured. Different embodiments of a dc pulse electrical test includes applying the dc current pulse for a fixed, predetermined period of time, or applying dc current pulse until a predetermined voltage is reached. A single dc pulse may be used, or multiple pulses may be used in a single test. Varying levels of dc current may also be used as part of the dc pulse test. The characteristics of the voltage response with relation to the dc current disturbance is used to assess electrochemical cell performance. The characteristics of the electrochemical cell voltage response may include, but is not limited to, initial voltage drop, final voltage drop, time to final voltage, and curvature of the voltage signals.

To perform HPPC, a dc discharge current is injected into the DUT, followed by a dc charge current. Likewise, a dc charge current may be injected into the DUT, followed by a dc discharge current. Different embodiments of HPPC include applying each of the dc current pulses for fixed, predetermined periods of time, or applying each of the dc current pulses until predetermined DUT voltages are reached. A single pair of bidirectional dc pulses may be used, or multiple pairs of bidirectional dc pulses may be used in a single test. Varying levels of dc current may also be used as part of the HPPC. The characteristics of the voltage responses with relation to the HPPC current disturbances are used to assess electrochemical cell performance. The characteristics of the electrochemical cell voltage responses may include, but are not limited to, initial voltage drop at charge pulse, final voltage drop at charge pulse, time to final charge voltage, initial voltage drop at discharge pulse, final voltage drop at discharge pulse, time to final discharge voltage, and curvature of the voltage signals.

To perform an ac test, an ac perturbation current is injected into the DUT, and a resulting ac voltage response signal is measured. A frequency sweep may be performed, and cell characteristics such as impedance can be gathered for some frequency range of interest. EIS is a typically sensitive procedure because it requires injection and measurement of small ac signals. To perform EIS, three conditions must be satisfied: linearity, stability, and causality.

The condition of linearity is satisfied when the applied ac amplitude is small enough to approximate or assume linear electrochemical behavior. An ac voltage amplitude range of 5 mV to 20 mV with a 10 mV nominal is generally the rule-of-thumb range of the ac voltage signal, though other voltage amplitudes of the ac voltage signal may be used so long as the linearity requirement is satisfied. This is a challenge because it means electronic instrumentation must have very small voltage resolution, typically less than 10 mV. Because of a wide frequency range, the instrumentation must also be able have relatively high sampling rates, often above 10 kHz, compared to typical cell measurement devices. These requirements make measurement instrumentation expensive. The condition of stability is satisfied when the overall cell state does not change significantly throughout the data acquisition period of the test. The stability requirement reduces the window of EIS measurement in real-world conditions where the environment may not be controlled. The condition of causality is satisfied when the measured ac response is directly caused by the ac perturbation from the system, and external perturbations are not a factor. This is also a challenge for real-world systems where external perturbations and noise may pollute the measured signals. The causality requirement also reduces the window of EIS measurement in real-world conditions for reasons similar from the stability requirement.

In a potentiostatic EIS system, the ac voltage is the perturbation, and the resulting ac current response is measured as a response signal. In a galvanostatic EIS system, the ac current is the perturbation, and the resulting ac voltage response is measured as a response signal. The impedance of the cell is governed by Ohm's law $$|Z|\angle\phi = \frac{V}{I},$$

where Z, V, and I are complex signals and $\phi$ is the phase difference between V and I, measured in radians or degrees. The terms can also be represented in cartesian or rectangular forms $$|Z|\angle\phi = Z_{Re} + jZ_{Im} = \frac{|V|}{|I|}e^{j\phi} = \frac{V_{Re} + jV_{Im}}{I_{Re} + jI_{Im}} \qquad \text{Eq. 1}$$

The ac impedances may be plotted in a bode plot or a nyquist plot for analysis. This ac impedance is calculated over a range of frequencies, where the range is frequency dependent. In the embodiment of a plurality of high capacity lithium manganese oxide battery cells, a range between 1 mHz to 5 kHz may be of interest. In an embodiment that uses nickel manganese cobalt battery cells, a range between 10 mHz to 100 kHz may be of interest. The frequency range depends on the exact chemistry, electrochemical cell manufacturer, cell capacity, construction of the cells, and the desired use case. For lithium batteries, Zcell is typically in the range below 1Ω, and could be as low as tens of μΩ for lower impedance cells. For these lithium batteries with sub-10 mΩ impedances, it means that a relatively large ac current is required to yield a measurable ac voltage signal. These parameters impose the constraints and requirements of the EIS system. The embodiments of the disclosed invention describe the general system architecture and method for impedance measurement, and further engineering design must be applied to tune the system for the target application.

Cell balancing is a technique that corrects an inevitable imbalances between cells. Imbalances can stem from many causes. In lithium battery applications, imbalances may stem from manufacturing tolerances between cells, temperature gradients across the battery pack, conductivity gradients across terminals and cabling in the battery pack, as well as difference in degradation between cells within the battery pack. The effects of imbalance may be benign, such as loss of overall system efficiency and total output, but the effects of imbalance may also be catastrophic, leading to single cell failure if the imbalance is great enough. Each system is subject to different conditions, and the balancing system must account for these differences appropriately for each application and system.

In electrochemical storage systems, where imbalances typically lead to "strong" or "weak" cells, a balancing system must compensate for variation in cell and parallel group performance. By way of example, a balancing system may "weaken" the strong cells by bleeding energy from them in order for the strong cell to be closer in performance to the weak cells. This reduces the imbalance between the plurality of cells, but is inefficient, as the average performance of cells is brought lower. By way of another example, a balancing system may "strengthen" the weak cells by pumping energy into them in order for the weak cell to be closer in performance to the strong cells. This reduces imbalance between the plurality of cells by bringing the average performance of cells higher, but requires an external source of energy which may be impractical. By way of another example, a hybrid system may weaken the strong cells and strengthen the weak cells by taking energy from strong cells and pumping the excess energy to the weaker cells. In this system, the average performance of cells remains the same, but the imbalance of the system reduces.

The hardware elements of one embodiment of the multi-port power system is shown in FIG. 1 for a five series-cell electrochemical system, however many other cell numbers can work as well. The electrochemical cells 112A, 112B, 112C, 112D, and 112E are member cells within a plurality of series cells, and the cells are electrically connected in a series configuration. Each cell may also contain a plurality of cells that are electrically connected in parallel. By way of example, one embodiment of the present system 100 comprises of a power converter circuit 102, a measurement circuit 104, an isolated power converter circuit 106, a secondary energy storage device (SESD) 108, a power multiplexer 110, a charge management controller 114, and auxiliary circuits 116. The power converter circuit 102, the SESD 108, and auxiliary circuits 116 sit on a floating plane, and may electrically connect to individual member cells 112A, 112B, 112C, 112D, or 112E depending on the control. The power converter circuit 102 can inject energy into or out of at least one member cell within the plurality of series-cells 112A-E through the power multiplexer 110. The target cell becomes a device under test (DUT) when the power multiplexer 110 electrically connects the target cell to the power converter circuit 102. The secondary energy storage device 108 provides local energy storage within the system to enable rapid charge or discharge for characterization and/or active balancing. The SESD 108 may comprise of an energy storage device such as a small secondary lithium battery, a large capacitor, an ultracapacitor, or a fuel cell. The isolated power converter circuit 106 provides power to the floating plane through some form of galvanic isolation, and has a primary side, and a secondary side. The primary side of the isolated power converter circuit 106 may be electrically connected to the plurality of series-cells 112A-E, or may be electrically connected to an external power source. The secondary side of the isolated power converter circuit 106 may be electrically connected directly to the SESD 108, or directly to the power multiplexer 110. The charge management controller 114 may be programmed with instructions to operate the system in various modes, with the goal to efficiently manage power and energy transfer within the system while maintaining safe operating limits of the various components. The auxiliary circuits 116 include on-board power supplies and other interfacing electronics. The hardware embodiments may behave as both a cell characterization system and as an active balance system.

In some embodiments, the charge management controller 114 may be a processor. Suitable processors include but are not limited to microcontrollers (MCUs), real-time operating system (RTOS) microprocessors, digital signal processors (DSPs), complex programmable logic devices (CPLDs), field-programmable gate arrays (FPGAs), application specific ICs (ASICs), other computational devices, or a hybrid combination of these. Processing power and speed, signal routing constraints, power requirements, voltage requirements, desire for redundancy, and cost are all factors that may be taken into consideration when choosing an embedded processor or combination of embedded processors. By way of example, the power converter control processes may be embedded into an ASIC, the high speed signal processing tasks to measure, condition, and filter the measurement signals may be handled exclusively on a DSP, while energy management decisions may be handled on an MCU. In another embodiment, the power converter controls, the high speed signal processing, and the energy management decisions may all be handled in an FPGA.

The power multiplexer 110 comprises of a plurality of switches that control the conduction paths in the system. Each configuration of the power multiplexer 110 represents a connection from a cell in the plurality of cells to the floating plane. Each switch must electrically isolate when not conducting, and is controlled by some 'on' or 'off' signal that commands the switch to conduct. The system selects the target cell within the plurality of series cells, and the control signals operate in a manner to enable current flow from the target cell to the power converter circuit 102. The switches must be controlled in a way where no two cells of 112A-E are shorted together or in any configuration that induces unwanted high circulating currents. Generally, multiplexer switches are operated in pairs to enable current flow to a single target cell of the plurality of series cells to ensure safe operation. Power multiplexer 110 switches must provide ample isolation between a selected cell and the floating plane. A network of external semiconductor transistors controls the system's conduction paths. The choice and duration of conduction paths depends on the desired test, and can be controlled by embedded software code. Safe operation of the system must be ensured. Proper failsafes and protections can be incorporated as well within the scope of this invention.

By enabling various conduction paths in the system, power and energy flow must adequately be maintained for safety. The voltage and current stresses of the series cells and SESD must not be violated to avoid compromising the safety of the system. This means that certain elements of the embodiments must maintain electrical isolation from each other. The power converter circuit 102, the measurement circuit 104, the SESD 108, and some embodiments of the charge management controller 114 and auxiliary circuits 116 must be electrically isolated from the system ground GND-stack. By way of example, the auxiliary circuits 116 may include relevant electrical power supplies for grounded circuits, as well as for electrically isolated circuits in the system. These isolated electrical power supplies typically draw power from the non-isolated power supplies, and electrical isolation must be maintained between them. By way of another example, the charge management controller 114 may be made up of several separate integrated circuits or microprocessors that serve dedicated purposes. Some of the elements of the charge management controller 114 may reside on the grounded circuits, and other elements of charge management controller 114 may reside on isolated circuits. In these scenarios, communication between these various charge management controller 114 elements require electrical isolation. An electrical isolation circuit may comprise of optocouplers, isolated capacitor circuits, transformer circuits, or other digital isolation technologies.

The active management of charge in the multi-port power system means that the amount of energy required by the operation must be pre-determined, and that the SESD voltage response to the test must be characterized on-board. In one embodiment, this may be achieved by carefully monitoring the salient system voltages and using the real-time voltage measurement as indication for the system's performance capabilities. A control mechanism for maintaining safe SESD 108 operation involves keeping the voltage of the SESD 108 within a safe operation range between a minimum limit and a maximum limit. A more accurate characterization of the SESD leads to more specific calculation of a target SESD voltage. In an embodiment that uses a rechargeable battery such as a lithium-ion battery as the SESD 108, an accurate measure of SESD battery state-of-charge may be required for safe operation. In embodiments where a capacitor, a supercapacitor, and even certain lithium-ion batteries are used for the SESD 108, accuracy in the target SESD state-of-charge may not be as important for system operation, and keeping the SESD 108 within a voltage range may be sufficient. This reduces the cost and complexity of the onboard sensors and calculation significantly by employing a simple voltage-based mechanism for SESD voltage control.

In an embodiment that uses a supercapacitor for the SESD, the size of capacitance is governed by the amount of energy required to perform an electrical test, or perform a charge transfer between cells. To perform an EIS test on an electrochemical cell, the minimum frequency requirement of the EIS test dictates the minimum capacitance, which is given by $$C = \frac{I_o}{\pi f_{EIS} V_{SC}} \qquad \text{Eq. 2}$$

where C is the capacitance, $I_o$ is peak current of a sine wave, $f_{EIS}$ is EIS carrier frequency, and $V_{SC}$ is the voltage of the supercapacitor. This is the capacitance required to source a half-wave of charge for the purpose of EIS from an SESD 108 supercapacitor at a particular frequency. By way of example, a system requiring a 5 $A_{rms}$ perturbation current, and 1 Hz minimum EIS frequency would require a minimum SESD 108 supercapacitor size of 338 mF, whereas a system requiring a a 5 $A_{rms}$ perturbation current, and a 0.1 Hz minimum EIS frequency would require a minimum SESD 108 supercapacitor size of 3.38 F. In practice, however, the SESD 108 capacitance must be larger to maintain a minimum SESD operating voltage. The actual voltage minimum limit is dictated by the design parameters such as minimum SESD voltage, nominal operating voltage of batteries, and electronic device ratings. The voltage element $V_{SC}$ becomes the usable voltage range of the SESD 108. In the embodiment of a 6V rated supercapacitor with a 4.5V minimum voltage, the usable voltage range $V_{SC}$ of the supercapacitor is 1.5V. As such, a system requiring a 5 $A_{rms}$ perturbation current, and 1 Hz minimum EIS frequency would require a minimum SESD 108 supercapacitor capacitance of 1.06 F with 6V rating, whereas a system requiring a a 5 $A_{rms}$ perturbation current, and a 0.1 Hz minimum EIS frequency would require a minimum SESD 108 supercapacitor capacitance of 10.6 F with 6V rating.

Figure 2:
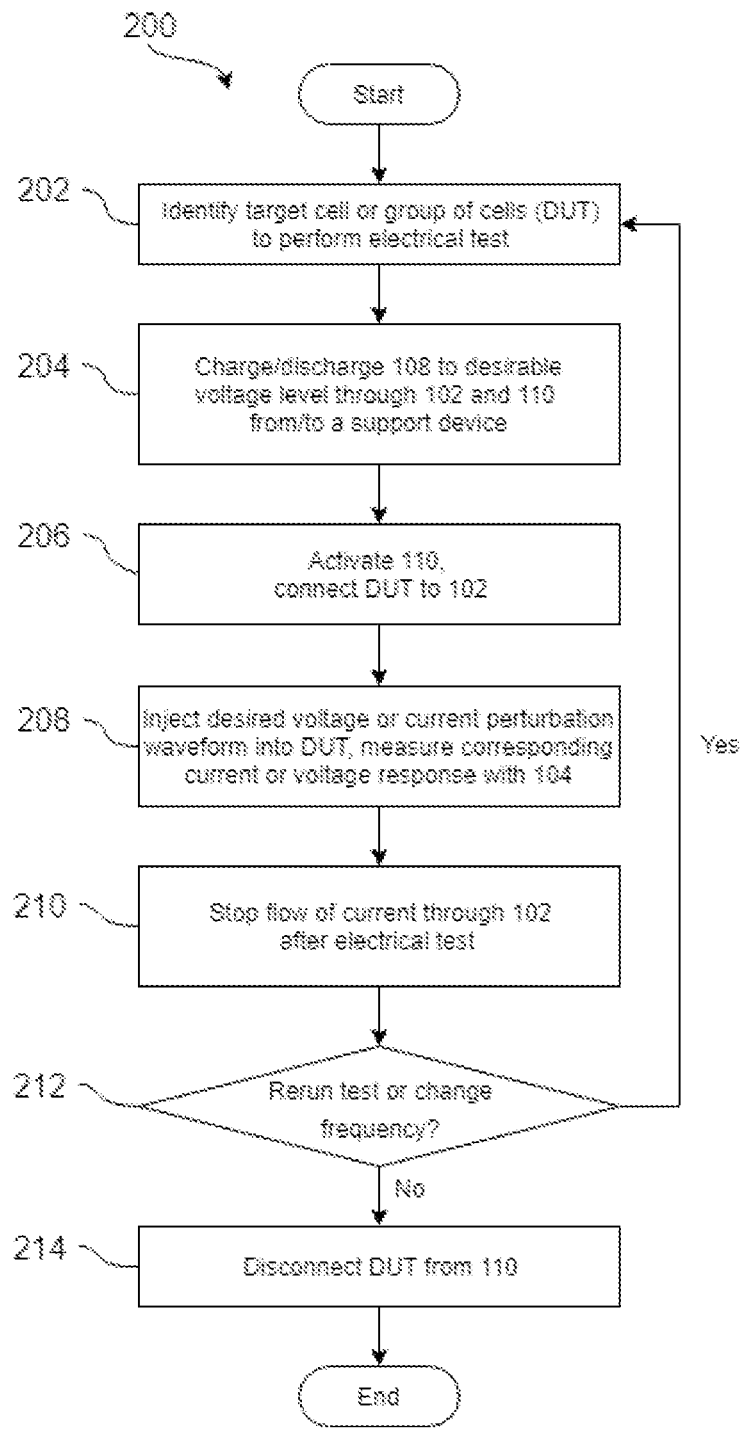
FIG. 2 shows an embodiment of instructions to acquire impedance measurements for a single electrochemical cell to maintain stability in the system.

FIG. 2 depicts an embodiment of a decision tree for managing balanced energy flow in the system between the plurality of cells 112A-E and the SESD 108 for the purpose of an impedance measurement test or for charge transfer operations. These instructions may be programmed into the charge management controller 114. In an embodiment, the SESD voltage determines the charge or discharge capability of the system. If a desired electrical test or balancing operation requires more or less energy than what the SESD can safely provide, measures must first be taken to maintain safe operation of the SESD. The decision tree outlines an embodiment of the steps to be taken to maintain proper SESD voltage. First, the target device for test is selected in step 202. Given the target device and diagnostic test, a desired level of voltage level of the SESD 108 is calculated, and the SESD 108 is charged or discharged to that desired level of voltage in step 204. During step 204, the system also chooses a support device or system to charge/discharge to/from to offload/source energy from/to the SESD 108. By way of example for a battery system, if needing to discharge the SESD 108, the system may identify a weaker cell among the plurality of series cells to offload the additional energy to. By way of another example for the same battery system, if needing to charge the SESD 108, the system may identify a stronger cell among the plurality of series cells as a support device to source energy from. Other support devices may be chosen depending on the system needs and depending on the end application. Once the SESD 108 is at the desired level of voltage, the power multiplexer 110 connects the power converter circuit 102 to the target cell through the power multiplexer 110, which is highlighted in step 206, and this target cell becomes the DUT. The power converter circuit 102 then injects either an electrical test signal, which can be in the form of a sinusoidal or other periodic waveform or non-periodic waveform, or injects a positive or negative current to the DUT. This is captured in step 208. Once the electrical test at that particular frequency or desired amount of charge transfer is complete, step 212 indicates that the system may repeat step 204 to step 210 until the full electrical test or charge transfer is complete. When the electrical test is complete, the DUT may be disconnected from the power multiplexer 110, and the process may end, as indicated in step 212. In another embodiment of the decision-tree, the DUT may be disconnected at any time during test due to failure or higher priority operations. In various embodiments of the decision-tree, the DUT may be disconnected several times throughout the processes to enable proper balancing of system voltages and charges. This may require several separate support devices and multiple operations of the power multiplexer 110 to achieve the desired test results and overall system balance.

In an embodiment where cell balancing or cell heating is to be performed, the steps in FIG. 2 may be altered to reflect the needs for the different goal. By way of example for cell balancing for the electrochemical system shown in FIG. 1, the strongest cell in the plurality of series cells is 112B, the weakest cell in the plurality of series cells is 112D, and all other cells are support devices 112A, 112C, and 112E. In this scenario, step 202 would focus on the state of imbalance between the plurality of series battery cells by identifying the strongest cell 112B and weakest cell 112D, as well as the relative strength of the support devices 112A, 112C, and 112E, instead of identifying a DUT for electrical test. Step 204 may consist of calculating the amount of energy available to discharge from the strongest cell 112B and the amount of energy required to charge the weakest cell 112D, and the current state-of-charge of the SESD 108. The requirement is to keep the SESD 108 voltage within safe operating limits while transferring energy from the strong cell to the weak cell. Identification of strongest cell 112B and the weakest cell 112B may consist of a simple voltage comparison, where a strongest cell 112B has the highest voltage among the plurality and the weakest cell 112D has the lowest voltage among the plurality, or identification of the strongest cell 112B and the weakest cell 112D may consist of more complex state-of-charge calculations based on both voltage and current measurement of cells. The complexity of the cell-to-cell comparison is dependent on the end application. Step 206 may consist of navigating to the strongest cell 112B through the power multiplexer 110, and step 208 consists of discharging that strongest cell 112B based on the decision from step 204. The current waveform in this embodiment may be a dc-signal, or it may be some periodic or nonperiodic ac signal. In the event that the SESD 108 reaches the maximum limit or the minimum limit for safe operation, the process continues to step 210, where power flow is stopped, and the system makes the decision in step 212 whether to repeat the step 202 through step 210.

If the charge balancing operation is complete, the power multiplexer 110 may disconnect from the strongest cell 112B in step 214. If the operation is not yet complete, the process may loop back to step 202 to again calculate the state-of-imbalance of the system. In this iteration of the process, step 204 determines whether to charge to or discharge from any one member cell 112A-E within the plurality of series cells. For step 206, the power multiplexer 110 may then navigate to the weakest cell 112D. Then for step 208, the SESD 108 would discharge, and transfer energy into the weakest cell 112D until it has reached the predetermined target voltage or state-of-charge value. In the event that the SESD 108 reaches the minimum limit for safe operation before the weakest cell 112D reaches its predetermined target voltage or state-of-charge value, the process then again loops back to step 202 to continue the balancing operation to recharge the SESD 108 from the strongest cell 112B. The process repeats until the weakest cell 112D reaches the desired level of voltage or desired level of state-of-charge. In each iteration of the process, new strong and weak cells may be identified, and this way, the balancing operation may require tapping into several of the member cells 112A-E throughout the process. When the balancing operation is complete, all cells may be disconnected from the power multiplexer 110, and the process may end, as indicated in step 216. In another embodiment of the decision-tree, the DUT may be disconnected at any time during test due to failure or higher priority operations. In various embodiments of the decision-tree, the DUT may be disconnected several times throughout the process to weave in other operations. This may require several separate support devices and multiple operations of the power multiplexer 110 to perform the electrical test and achieve overall system balance.

In an embodiment of a self-heating system, a nonzero current may be driven into any of the individual member cells 112A, 112B, 112C, 112D, or 112E through the power multiplexer 110 and the power converter circuit 102. The energy required to source and sink the nonzero current comes from the SESD 108. By way of example the self-heating of the electrochemical system, the target cell 112C is the cell to be heated, and all other cells are support devices 112A, 112B, 112D, and 112E. In this scenario, step 202 would identify the target cell 112C. Step 204 may consist of calculating the dc-offset current of a nonzero current if a dc current is to be utilized, the amplitude and frequency of the nonzero current if an ac current is to be utilized, the dc-offset, amplitude, and frequency if a hybrid dc+ac nonzero current is to be utilized, as well as the duration of self-heating operation. The type of nonzero current utilized is dependent on the application. Step 204 may also consist of determining whether the SESD 108 has ample charge to complete the self-heating test. Step 206 may consist of navigating to the target cell 112C through the power multiplexer 110, and step 208 consists of driving the nonzero current into cell 112C for some dc-offset, amplitude, frequency, and duration based on the decision from step 204. In the event that the SESD 108 reaches the maximum limit or the minimum limit for safe operation, the process continues to step 210, where power flow is stopped, and the charge management controller 114 makes the decision in step 212 whether to repeat the step 202 through step 210.

If the cell heating operation is complete, the power multiplexer 110 may disconnect from the target cell 112C in step 214. If the operation is not yet complete, and the voltage or charge of the SESD 108 has reached a limit, the charge management controller 114 may decide to loop back to step 202 and through to step 214, first to charge up or discharge the SESD 108 to a safe level, and then a second time back to step 202 and through to step 214 to continue self-heating of the target cell. The process repeats until the self-heating target cell 112C reaches the desired internal temperature. In each iteration of the process, various support devices may be utilized to source or sink electrical energy from or to the SESD 108, and this way, the self heating operation may require tapping into several of the support devices 112A-E throughout the process. When the self heating operation is complete, all cells may be disconnected from the power multiplexer 110, and the process may end, as indicated in step 216. In another embodiment of the decision-tree, the DUT may be disconnected at any time during test due to failure or higher priority operations. In various embodiments of the decision-tree, the DUT may be disconnected several times throughout the process to weave in other operations. This may require several separate support devices and multiple operations of the power multiplexer 110 to completely perform the self heating operation.

Figure 3:
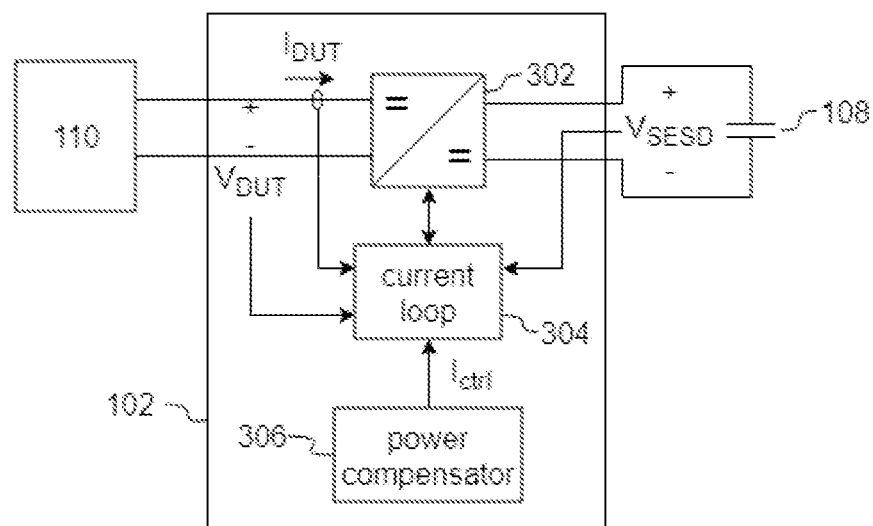
FIG. 3 depicts a block diagram version of an embodiment of a power converter circuit.

FIG. 3 shows an embodiment of the power converter circuit 102, where a dc-dc converter 302 can charge or discharge current into the target cell. In this embodiment, the power converter circuit 102 is able to inject a sinusoidal, a dc-pulse, or other perturbation current into the DUT for the purpose of performing a galvanostatic electrochemical impedance spectroscopy (EIS) test, a DC pulse test, a HPPC test, or other active characterization test. The power converter circuit 102 is to enable power transfer between one or more series-connected cells 112A-E in the plurality of cells or modules, electrical storage devices such as capacitors or ultracapacitors, or power sources for the purpose of balancing the plurality of cells connected in series. Another embodiment may include a unidirectional power conversion circuit, where current can only flow in one direction. The unidirectional power conversion circuit may perform dc pulse testing but is incapable of performing true HPPC and ac signal tests where bidirectional current flow is required. With the unidirectional power conversion circuit, a form of HPPC and ac testing may be achieved where some ac signal may be superimposed into a dc biased signal, however, this method lends itself to mismatched charge between cells, and makes active balancing more challenging.

In an embodiment, the dc-dc converter 302 is controlled by a current loop 304, which takes input from a waveform generator within a power compensator 306. The power compensator 306 can generate any waveform, whether sinusoidal, square, sum-of-sines, sawtooth, or other periodic or non-periodic waveforms, and this signal acts as an input to the power compensator 306. In certain embodiments, the power converter may perform only the electrical test on the DUT. In another embodiment, the power converter may only be used for power transfer for balancing. In another embodiment, the power converter may perform both the electrical test and balancing at the same time.

Figure 4:
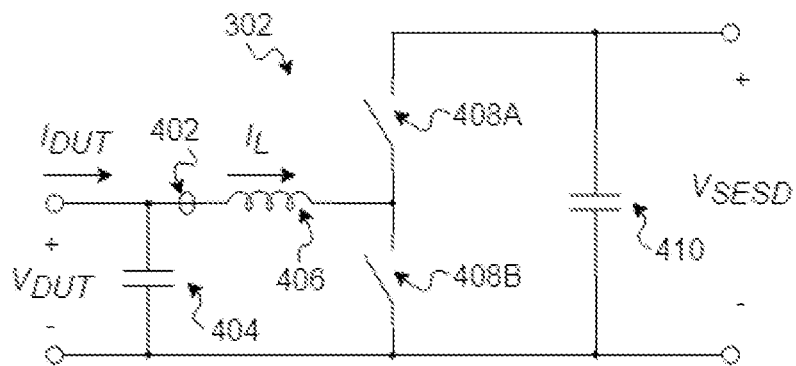
FIG. 4 depicts an embodiment of the power converter circuit, as a boost converter in one direction of current flow, and a buck converter in the other.

An embodiment of the dc-dc converter 302 is shown in FIG. 4, where the dc-dc converter 302 is a switch-mode power supply (SMPS) and acts as a boost converter when current flows from the DUT to the SESD 108, and the dc-dc converter 302 acts as a buck converter when current flows from the SESD 108 to the DUT. In this system, the SESD voltage VSESD should be sized larger than that of the voltage of the DUT VDUT. The orientation and choice of device is dependent on the application. The dc-dc converter 302 may be an isolated or a non-isolated topology depending on the application, The dc-dc converter 302 can be selected from at least one member of a power electronics topology set consisting of: a buck, a boost, a buck-boost, a non-inverting buck-boost, a single-ended primary-inductor converter (SEPIC), a dual-active bridge, a flyback, a forward, a Cuk, a resonant converter, or other such switched-mode power supplies.

In a SMPS, semiconductor switches are operated at high frequency, and are used to direct power between power sources, loads, inductive elements, and capacitive elements of the circuit. Controlling the switching frequency fs and duty cycle of the various switches controls the balance of energy in the system, and can be used to affect system parameters such as input current and voltage and output current and voltage. The semiconductor switches may be active switches such as field-effect transistors (FETs), bipolar junction transistors (BJTs), insulated gate-bipolar transistors (IGBTs), or other such active semiconductor transistors, or they may be passive switches such as diodes, or other such passive switching semiconductor devices. The switches are typically controlled using voltage or current gating signals with a specific period and duty cycle. The power compensator 306 dictates the period and duty cycle of the converter in an open-loop scenario, where the parameters are known previously, or in a feedback scenario to actively adapt duty cycle and period based on system performance parameters.

To achieve bidirectional current flow in the DC-DC converter 302, the switches must both be transistors. The synchronous switches 408A and 408B conduct in complementary fashion, and are used to direct bidirectional current flow. The inductor 406 limits dc-dc converter 302 current flow depending on the voltage across the inductor, as controlled by the synchronous switches 408A and 408B, where the rate of change of inductor current $I_L$ is given by:

$$\Delta I_L = \frac{V_{DUT} - V_{SESD}}{f_s \cdot L}. \qquad \text{Eq. 3}$$

In the system, $f_s$ is the switching frequency of the DC-DC converter 302. Controlling the synchronous switches 408A and 408B at high frequency affects the direction and magnitude of the inductor current $I_L$. To tightly control inductor current $I_L$ and DUT current $I_{DUT}$, the ripple current can be tightly controlled. The inductor ripple current can be managed by adjusting the DUT voltage $V_{DUT}$, SESD voltage $V_{SESD}$, the switching frequency $f_s$, or a hybrid combination of the these.

The inductor 406 should be sized to reduce the ripple current size to smaller than the target EIS carrier current while also staying within a switching frequency range allowed by the dc-dc converter 302 power compensator 306. Typical switching frequency values for various embodiments of power electronics switching devices range from 1 kHz to 100 kHz for insulated-gate bipolar transistors (IGBTs), 1 kHz to 300 kHz for silicon-based transistors, 10 kHz to 1 MHz for silicon-carbide transistors, and 100 kHz to greater than 1 MHz for Gallium-Nitride transistors. Other transistor types can also be used in various other embodiments that are not described. Another embodiment of the dc-dc converter 302 may be a bidirectional, non-inverting buck-boost converter that allows bidirectional current flow and both step-up and step-down voltage operation in both directions. Choice of topology is dependent on application requirements. By way of example, in an embodiment using nominal 3.7V lithium-battery cells as the plurality of cells 112A-E, where a DUT current of 5 App is desired, the silicon-based transistors are used for the synchronous switches 408A and 408B, and a 6V SESD is used, the inductor 406 can sized to 11.5 µH to maintain 200 kHz switching operation and 1 App inductor ripple current. The values and sizings of the various elements of the system should be tuned for the application's specifications. The DUT-side filter capacitor 404 filters high frequency ac signals on the DUT side of the dc-dc converter 302, and the SESD-side filter capacitor 410 filters high frequency ac signals on the SESD side of the dc-dc converter 302. The various filter capacitors are sized on a per application basis, and can be tuned depending on the end-application's conductive and/or radiated electromagnetic compatibility requirements.

Typical values of the filter capacitors range from below 1 µF to several Farads, but could be different depending on the application. In certain embodiments, the dc-dc converter 302 can be built using discrete components on a printed circuit board (PCB) assembly. In other embodiments, the dc-dc converter 302 can be built into an application specific integrated circuit (ASIC), or a combination of the two, where the synchronous switches 408A and 408B are integrated into the ASIC, while the inductor 406 is off-chip. The choice of build is dependent on the application specifications.

Figure 5:
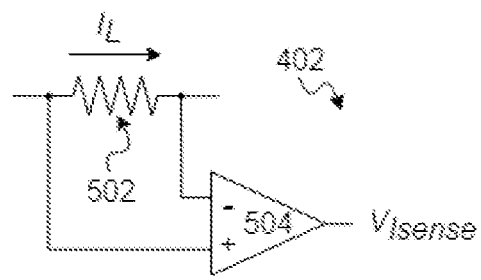
FIG. 5 depicts an embodiment of the current sensing circuit.

Inductor current IL is measured with a current sensing circuit 402, where an embodiment can include a current sense resistor 502 and a current sense amplifier circuit 504, as shown in FIG. 5. The current sense amplifier circuit 504 amplifies the sensed voltage across current sense resistor 502 and has a gain of Gcs, where Gcs is sized accordingly depending on the application. The output of the current sense amplifier circuit 504 is a voltage signal VIsense. In another embodiment of the current sense circuit comprises a magneto-resistive sensor that serves the similar purpose to measure inductor current. Yet another embodiment of the current sense circuit comprises a hall-effect sensor for current measurement.

Figure 6:
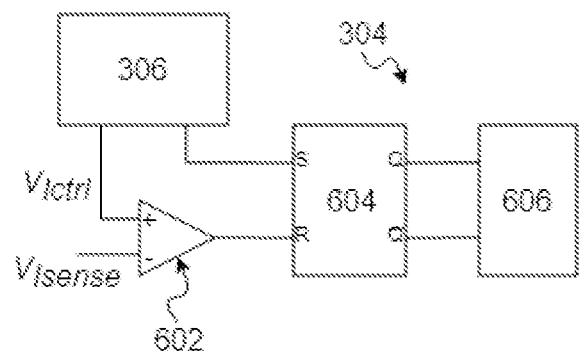
FIG. 6 depicts an embodiment of the power converter circuit current control scheme.

An embodiment of the current loop 304 is shown in FIG. 6, where the VIsense signal from the current sense amplifier circuit 504 and a reference control signal, VIctrl, from the power compensator 306 are fed into a comparator 602. The VIctrl signal from the power compensator 306 is typically in the form of an analog voltage signal derived from a digital-to-analog converter (DAC), though other analog voltage generating techniques may be used. The generated analog voltage is used as a reference to sensed current, which is in the form of voltage signal VIsense. The envelope of the VIctrl signal is the shape of the desired current waveform, whether the desired current signal is sinusoidal, square, sum-of-sines, sawtooth, or other periodic or some non-periodic waveform. The output of comparator 602 is fed into the reset port of an SR flip-flop 604, where the set port of the SR flip-flop 604 comes from the power compensator 306. To shape the current for the electrical test, any version of a current-mode control technique for SMPS may be used, including peak current-mode control, valley current-mode control, peak current-mode control with slope compensation, peak current-mode control with an off-time generator, valley current-mode control with slope compensation, valley current-mode control with an on-time generator, hysteretic current mode control, or average current-mode control. Each current control technique has its benefits and drawbacks, and the favorable technique varies by application. In a separate embodiment, both the set and reset signals of the SR flip-flop 604 can be derived from parallel VIsense and comparator 602 circuits. The SR flip-flop 604 outputs Q and Q' are complementary signals that are fed into a gate driver circuit 606 and converted into gate signals that drive the synchronous switches 408A and 408B. In certain embodiments, the current loop 304 can be built using discrete semiconductor components. In other embodiments, the current loop 304 can be entirely be built in firmware code inside an embedded controller or inside an ASIC, or some hybrid combination. The choice of build is dependent on the application specifications.

Figure 7:
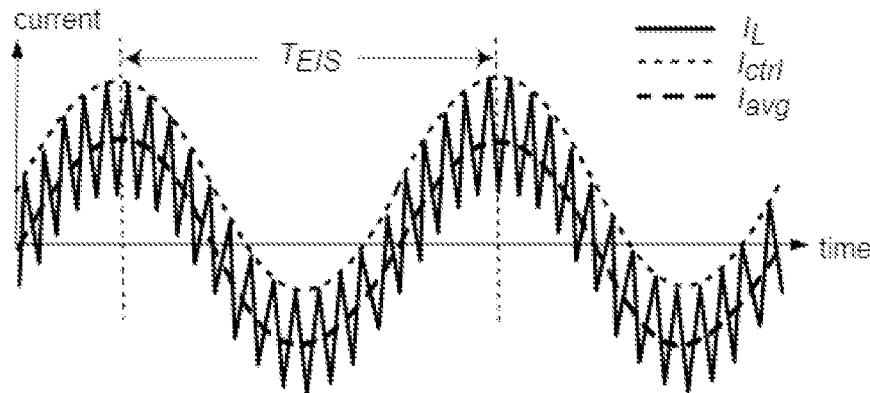
FIG. 7 shows various current waveforms for the device under test and the power converter circuit, according to an embodiment.
Figure 8:
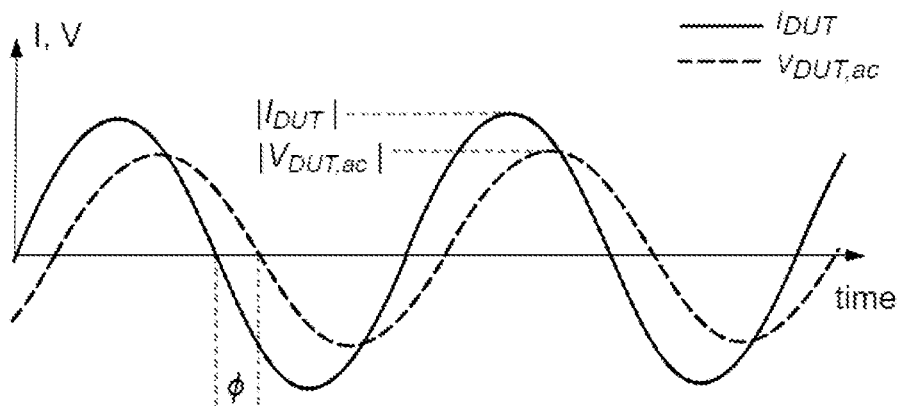
FIG. 8 shows the ac voltage and ac current waveforms for the device under test, according to an embodiment.

FIG. 7 depicts an example sinusoidal ac current waveform with high frequency inductor current $I_L$ and average inductor current Iavg, not shown to scale. The ac carrier current waveform is equivalent to the Iavg and the DUT current IDUT, and this current serves as the carrier waveform for inductor current IL. The inductor current is a high frequency, triangular current waveform, and is controlled by the synchronous switches 408A and 408B. The reference control signal Ictrl, which may take the form of some electrical voltage or current signal or a digital representation signal, is generated by the power compensator 306 and controls the shape of the inductor current. The DUT-side filter capacitor 404 filters out the high frequency triangular wave of the inductor current waveform so that IDUT is equivalent to the average inductor current, Iavg. Representative ac waveforms of device current and voltage are shown in FIG. 8. The power converter circuit 102 can also be used to produce dc pulse current and HPPC waveforms using the same architecture and circuitry. In the case of a dc pulse, the ac carrier current waveform becomes a dc pulse carrier waveform, and Iavg becomes a dc pulse. To perform the HPPC test, the ac carrier current waveform becomes the HPPC carrier current waveform.

The DC-DC converter 302 can also be used for the purpose of shuttling energy between the various cells in the series-stack and the SESD 108 for the purpose of active balancing. In an embodiment where the dc-dc converter 302 is bidirectional, an electrochemical cell may be both charged and discharged. During active balancing, the dc-dc converter 302 and the power multiplexer 110 behave in very similar same fashion as when performing series-cell EIS. The difference is in the dc-dc converter 302 control current Ictrl. During an electrical test such as EIS, dc pulse testing, or HPPC, Ictrl is a predefined dc or ac signal. During balancing, where by strengthening a weaker cell or weakening a stronger cell, the signal Ictrl may take the form of a periodic ac signal, a dc-signal, or a hybrid combination of dc and ac signals to reduce variance among the plurality of electrochemical cells. Additionally, during the electrical test, the measurement circuit 104 is operational, while during balancing operation, the measurement circuit 104 may not be in operation. In both cases, power is transferred from the DUT to the SESD or from the SESD to a DUT. The charge management controller 114 decides whether to operate in electrical test mode or in balancing mode.

Figure 9:
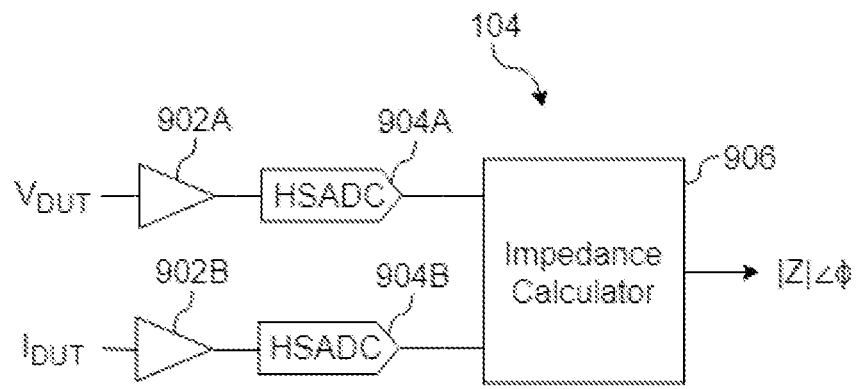
FIG. 9 shows an embodiment of the measurement circuit that uses external circuitry to measure both DUT voltage and DUT current.

The measurement circuit 104 measures or estimates transient or periodic voltage signals and transient or periodic current signals during characterization test operation. An embodiment of the measurement circuit during an EIS test is shown in FIG. 9, where an analog amplifier circuit 902A conditions the measured ac cell voltage signal, and an analog amplifier circuit 902B conditions the measured ac cell current signal, a high speed analog-to-digital converter (HSADC) 904A and 904B digitizes time-series analog ac voltage and ac current data, respectively, at a high sampling rate, and an impedance calculator 906 performs computations to determine magnitude and phase of the measured ac voltage and ac current signals, and to determine magnitude and phase of the impedance. By way of example, in an embodiment that requires up to 10 kHz EIS frequencies and 20 samples-per-second time resolution, the HSADC 904A-B must have a minimum sampling frequency of 200 k samples-per-second per ADC channel. To measure a 10 mV peak-to-peak ac-voltage signal with a minimum of 20 discrete points in the digital domain, the HSADC 904A must have 500 µV voltage resolution. The above values are examples of how to calculate the HSADC 904A-B requirements for a given system's parameters, and the actual sample-rate and resolution of the HSADC 904A-B depends on the desired accuracy of some ac impedance in the end application.

The analog amplifier circuits 902A-B may be one of or a combination of many analog amplifier types, including but not limited to at least one member of a filter set consisting of: unity gain buffers, inverting amplifiers, non-inverting amplifiers, differential, instrumentation, and difference amplifiers. These analog amplifier circuits 902A-B may be dc-coupled or ac-coupled. Each of these analog amplifier circuits 902A-B may be tuned to a specific gain and bandwidth based on selection of operational amplifier parts and their passive filter components such as resistors and capacitors. These resistors and capacitors are chosen selectively to filter unwanted noise in the signals, apply a gain to the pass-through signal, and create a buffer between the input signal and the output to the HSADC 904A-B.

Figure 10:
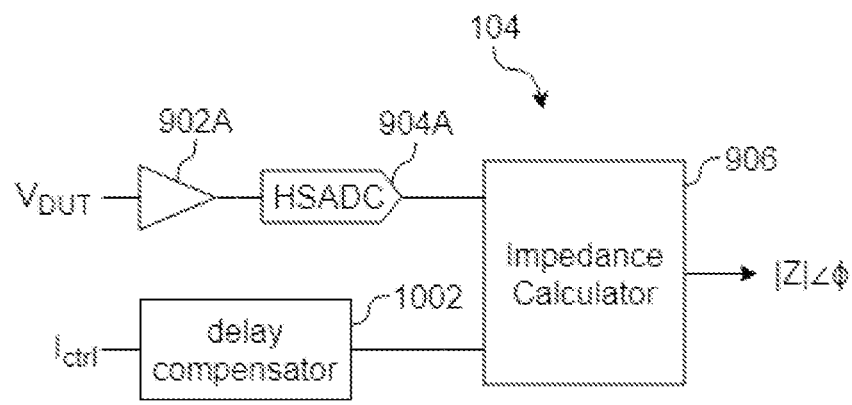
FIG. 10 shows an embodiment of the measurement circuit that only measures DUT voltage, and infers DUT current based on the current control scheme of the embodiment.

By way of example, an embodiment of the measurement circuit 104 is shown in FIG. 10 for a galvanostatic system, which leverages the current reference signal Ictrl in the power compensator 306 to eliminate the need for 902B and 904B of FIG. 9. This reduces the hardware complexity of the system to reduce costs. A delay compensator 1002 would adjust for delays between Ictrl and the actual EIS current, and accounts for delays associated with components such as DAC and comparator circuit response times, as well as delays due to transmission lines in the circuit boards. The various elements of the embodiments shown in FIG. 9 and FIG. 10 can be built entirely using discrete ICs, analog filter components and an embedded controller, can be entirely integrated into an ASIC, or some combination of the two. In another embodiment, analog methods may be used to calculate impedance phase and magnitude, which foregoes the need for the HSADC 904A, 904B, but requires specially tuned analog circuitry to be able to detect phase and magnitude at various frequency ranges.

The impedance calculator 906 may be of analog or digital implementation and is typically a multi-stage process. The filter may also be a multi-stage filtering, frequency, amplitude, and phase detection block. The filter stage may include but is not limited to frequency-dependent filters such as low-pass, a high-pass, a butterworth, a notch, or a band-pass filters, and/or a nonlinear filters such as maximum or minimum filters. Frequency, amplitude and phase detection may be achieved in many ways, including time-domain techniques that include but are not limited to slope detection, peak detection, cross-correlation, or zero-crossing detection as well as frequency-domain techniques that include but are not limited to pitch detection algorithms and fast-Fourier transform methods. FIG. 9 and FIG. 10 show a digital representation of the impedance calculator 906.

Figure 11:
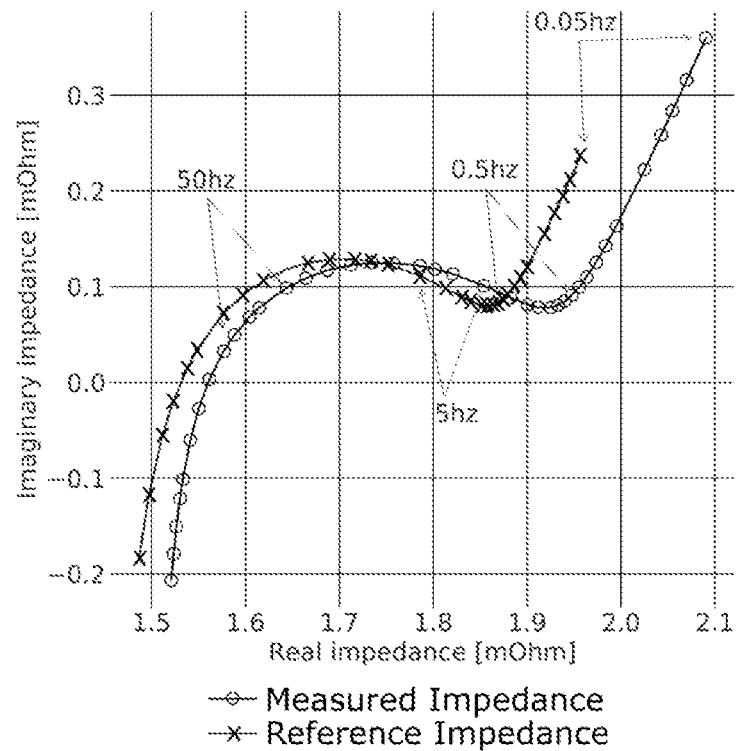
FIG. 11 shows measured impedance data on a lithium manganese oxide battery cell using two EIS systems: a reference off-the-shelf Gamry Instruments EIS analyzer, and the embodiments of the invention.

FIG. 11 shows measured impedance data in the form of a Nyquist plot on an embodiment of an automotive lithium manganese oxide battery cell using two different EIS systems: a reference off-the-shelf Gamry Instruments EIS analyzer, the Interface 5000E, and the embodiments of the invention. The Gamry Interface 5000E is used as a reference measurement to compare accuracy of impedance measurements across the frequency spectrum. The two systems are within +/−100 µΩ of each other in the critical frequency range 0.5 Hz to 200 Hz that reveals important electrode aging and charge transfer dynamics of the battery. The comparison of impedance measurements show close agreement between the different systems, and validates the accuracy of the embodiments of the invention.

Figure 12:
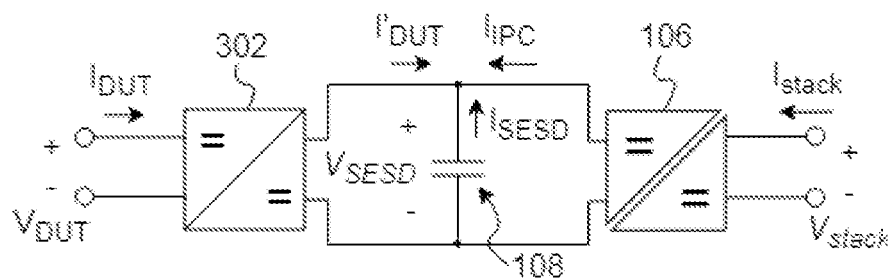
FIG. 12 depicts a block diagram of the various power converters that affect the secondary energy storage device current and voltage.

The isolated power converter circuit 106, the power converter circuit 102, and the power multiplexer 110 all serve to create alternate current flow paths between various series-stacked cells 112A-E and the SESD 108, as shown in FIG. 12. The purpose of creating alternate current flow paths is to increase flexibility in how power flows between cells. This serves many functions beyond performing the electrical EIS test including but not limited to balancing, self-heating, and performing other such diagnostic tests. In an embodiment, the isolated power converter circuit 106 may also be used to provide additional charge to the SESD 108. The isolated power converter circuit 106 is a switch mode power supply dc-dc converter 302 and provides electrical isolation between a primary side and a secondary side. In an embodiment, the primary side may be the plurality of electrochemical cells stacked in series, and the secondary side may be connected to the SESD 108. The isolated power converter circuit 106 uses the plurality of electrochemical cells stacked in series as a power sources, and charges or discharges the plurality of electrochemical cells as a group. The various currents flowing through the dc-dc converter 302, the SESD 108, and the isolated power converter circuit 106 are governed by $$-I_{DUT} = \eta_{302} \cdot I'_{DUT} = I_{IPC} + I_{SESD} \qquad \text{Eq. 4}$$

where η302 represents the efficiency of the dc-dc converter 302, I'DUT represents the current on the SESD-side of the dc-dc converter 302, IIPC represents the secondary-side current of the isolated power converter circuit 106, and ISESD represents SESD 108 current. The amount of current into and out of the SESD 108 affects its voltage, so the voltage of the SESD 108 is affected by the operating currents of the dc-dc converter 302 and the isolated power converter circuit 106. In this way, controlling the currents of the various SMPS in the system directly affects the operating voltage of the SESD 108. The charge management controller 114 takes into account these calculations.

In another embodiment, the primary side may be the series-connected cells, and the secondary side may be connected on the DUT-side of the power converter circuit 102. In yet another embodiment, the primary side may be electrically connected to an external power source as a source of electrical power for the system. The isolated power converter circuit 106 may be unidirectional or bidirectional depending on the application. An isolated power converter circuit 106 that is bidirectional would enable transfer of electrical power flow in both directions to, by way of example, charge or discharge the SESD 108. An isolated power converter circuit 106 that is unidirectional could only transfer electrical power into the SESD 108, or transfer electrical power out of the SESD 108, but it cannot do both within the same application. While a bidirectional converter gives more flexibility in the design, it is often more costly. In applications requiring low cost and not requiring power flow, an isolated power converter circuit 106 that is unidirectional would be preferred. Additional configurations can be provided as explained above.

Figure 13:
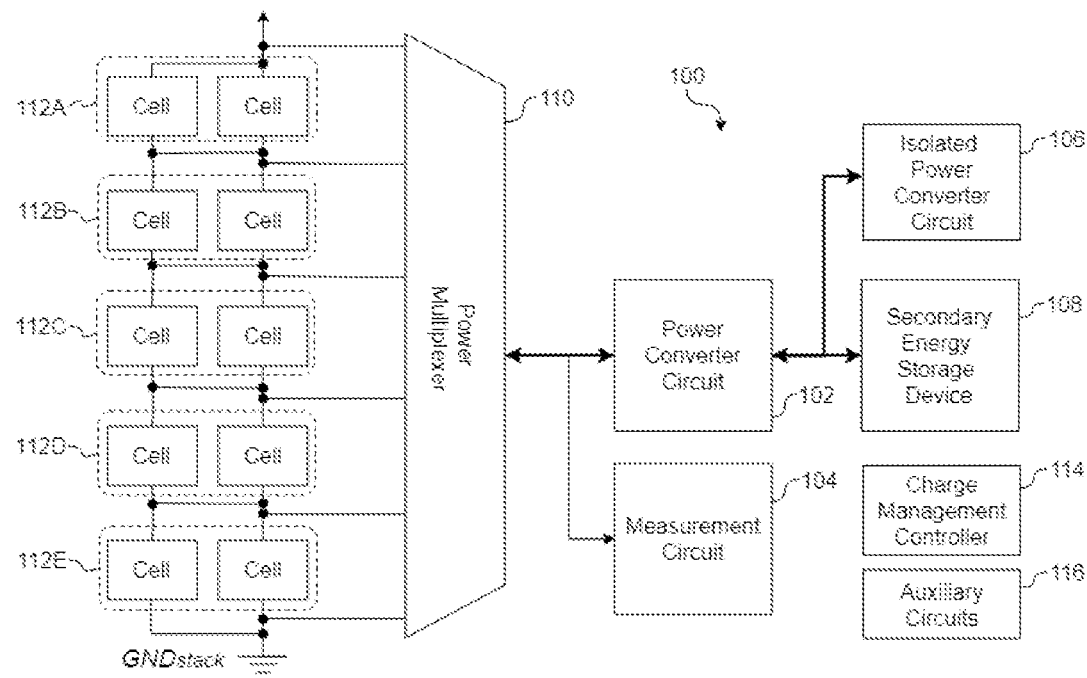
FIG. 13 shows an embodiment of the system hardware architecture where electrochemical cells are electrically connected in parallel and series configuration.
Figure 14:
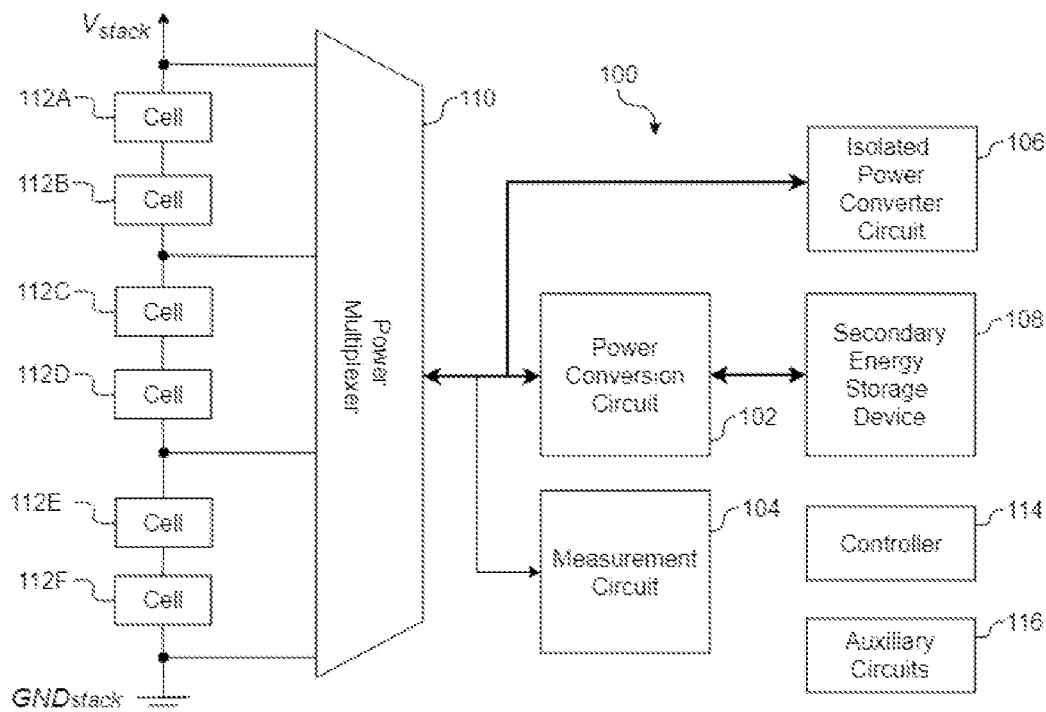
FIG. 14 shows an embodiment of the system hardware architecture where the more than one electrochemical cell connected in a series configuration is connected to each port of the multi-port power system.
Figure 15:
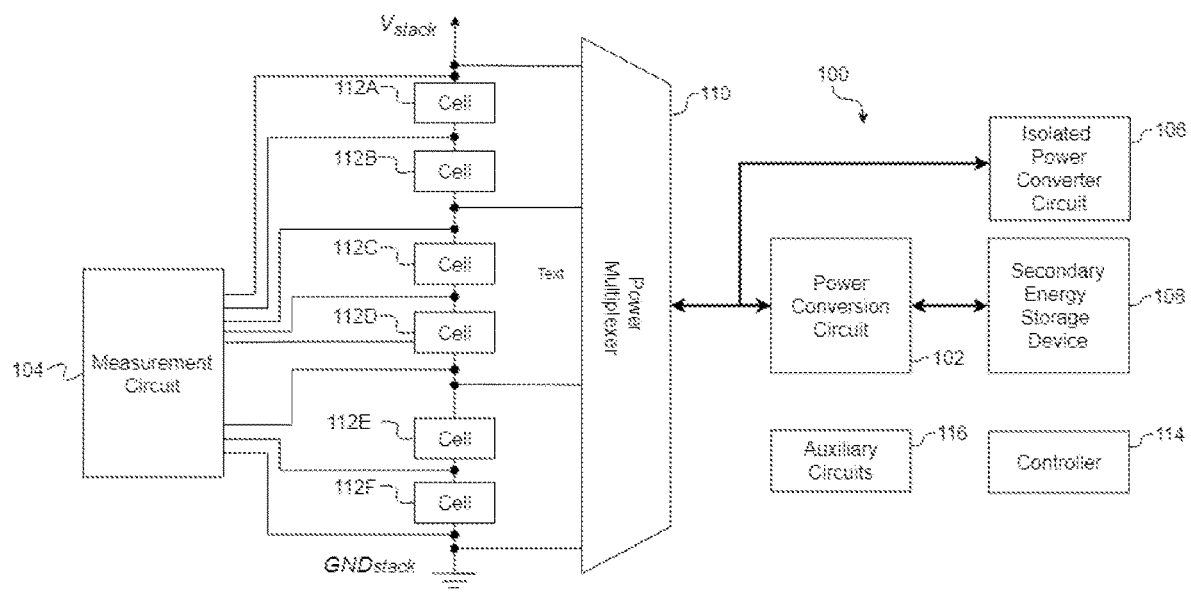
FIG. 15 shows an embodiment of the system hardware architecture where a measurement circuit is connected to the plurality of electrochemical cells separately from other embodiments.

Large battery systems in EVs and stationary storage typically have many cells connected together in both parallel and series configurations. For instance, the Nissan LEAF is a 96S2P configuration, meaning 96 cells in series and 2 in parallel. The Tesla Model S is 9674P has 96 cells in series and seventy-four cells in parallel. This dictates that the multi-port power system exists in multiple possible embodiments. An embodiment of the multi-port power system is shown in FIG. 13, where several parallel groups of cells 112A-E are electrically connected in series to make up the plurality of cells in a battery module. In this module/pack configuration, a plurality of electrochemical cells electrically connected in a parallel configuration are treated as a single cell and connected to a single cell tap in the power multiplexer 10. Another embodiment of the multi-port power system is shown in FIG. 14, where more than one cell connected in series may be connected across each tap of the power multiplexer. The power multiplexer 110 connects cells 112A and 112B under a single cell tap such that these series-connected cells are measured as a single unit. Yet another embodiment of the multi-port power system is shown in FIG. 15, where the measurement circuit 104 is electrically connected to each of the plurality of electrochemical cells 112A-F separately from the power multiplexer 110, the power conversion circuit 102, the SESD 108, and the isolated power converter circuit 106.

Figure 16:
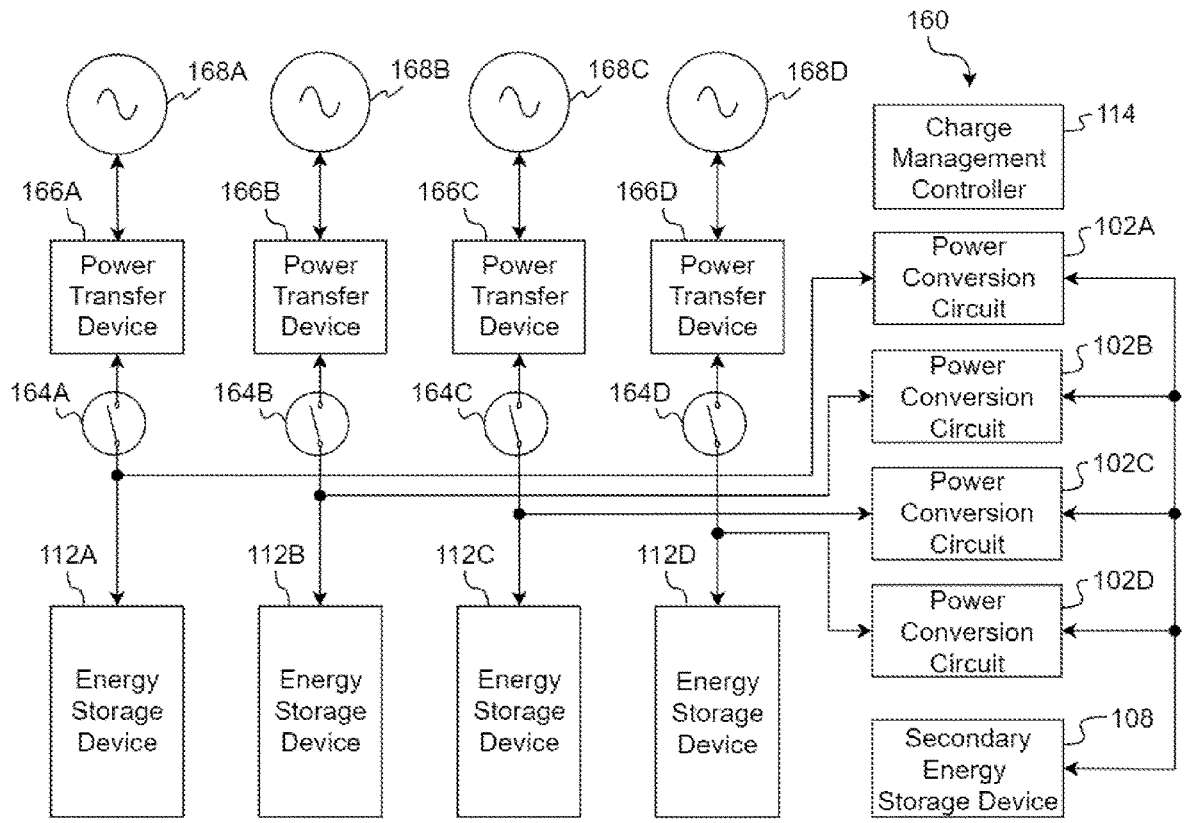
FIG. 16 shows an embodiment of the system with multiple energy storage devices, each connected to a multi-port power system.

Large battery systems may also contain groups of series and/or parallel cells connected together, where each group may contain its own management system. In these systems, multiple multi-port power systems can be connected in various ways to provide diagnostics for the energy storage devices. An embodiment of the system is shown in FIG. 16, where multiple energy storage devices are each connected to a multi-port power system. Each energy storage device 112 is connected to an ac electrical load 168 through a safety disconnect 164A-D and a Power Transfer Device 166, where the safety disconnect may be a circuit breaker, a mechanical relay, a contactor, a solid-state switch, or a fuse, and the Power Transfer Device is some type of dc to ac converter or inverter. In this configuration, a Power Conversion Circuits 102 is electrically connected to each energy storage device 112, and each of the Power Conversion Circuits 102 are electrically connected to a Secondary Energy Storage Device 108. In another embodiment, the safety disconnect 164A-D may contain more than one of the above safety elements. In an embodiment, the safety disconnect 164A-D may contain more than one of the above safety elements. In an embodiment, the ac electrical load 168 may be a motor, a generator, an electrical grid, or a combination of these.

Figure 17:
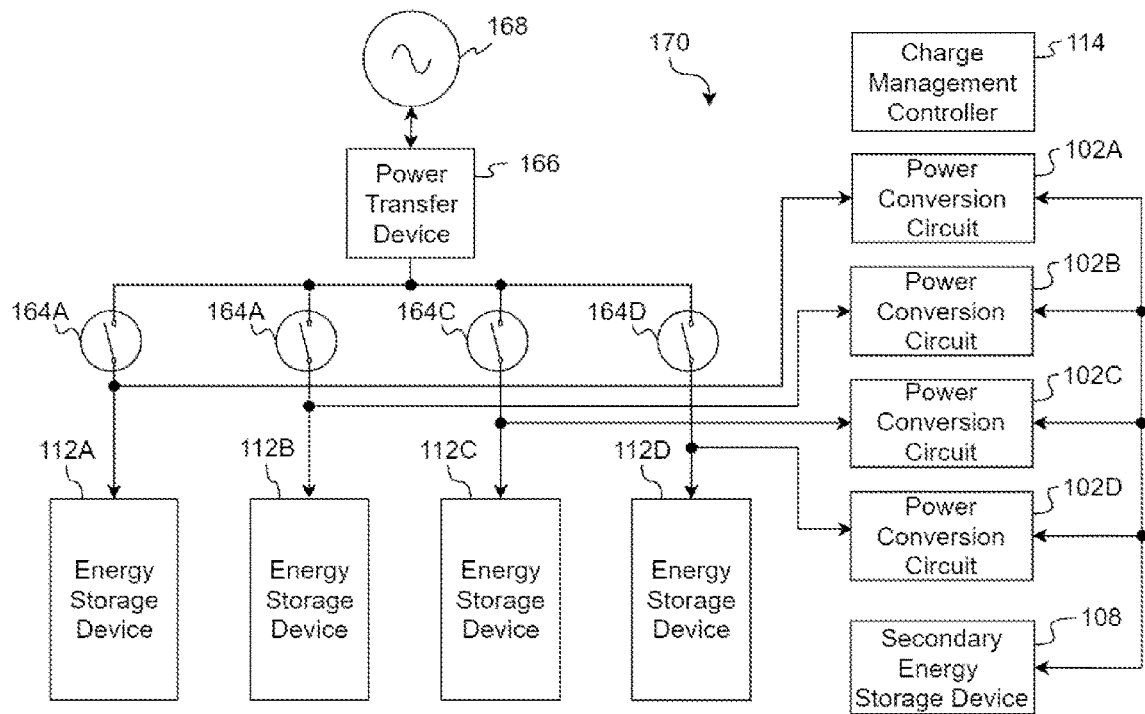
FIG. 17 shows an embodiment of a system with multiple parallel connected energy storage devices, each connected to a multi-port power system.
Figure 18:
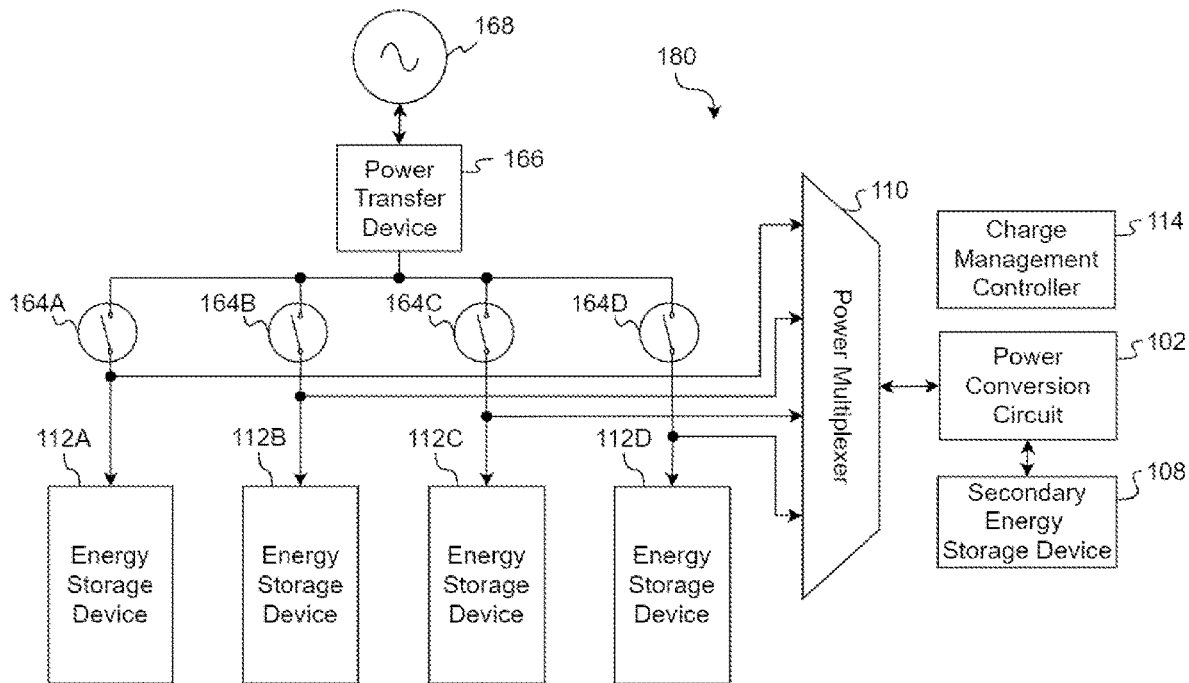
FIG. 18 shows an embodiment of a system with multiple parallel connected energy storage devices, each connected to a single multi-port power system through a power multiplexer.

Another embodiment of the system is shown in FIG. 17, where multiple parallel connected energy storage devices are each connected to a multi-port power system. FIG. 18 shows another embodiment of the system, where multiple parallel connected energy storage devices 112 are connected to a single Power Conversion Circuit 102 through a Power Multiplexer 110.

Persons of ordinary skill in the art may appreciate that numerous design configurations may be possible to enjoy the functional benefits of the inventive systems. Thus, given the wide variety of configurations and arrangements of embodiments of the present invention the scope of the invention is reflected by the breadth of the claims below rather than narrowed by the embodiments described above.

As used in this application, the term "a" or "an" means "at least one" or "one or more."

As used in this application, the term "about" or "approximately" refers to a range of values within plus or minus 10% of the specified number.

As used in this application, the term "substantially" means that the actual value is within about 10% of the actual desired value, particularly within about 5% of the actual desired value and especially within about 1% of the actual desired value of any variable, element or limit set forth herein.

All references throughout this application, for example patent documents including issued or granted patents or equivalents, patent application publications, and non-patent literature documents or other source material, are hereby incorporated by reference herein in their entireties, as though individually incorporated by reference, to the extent each reference is at least partially not inconsistent with the disclosure in the present application (for example, a reference that is partially inconsistent is incorporated by reference except for the partially inconsistent portion of the reference).

Unless otherwise defined, all technical terms used herein have the same meaning as commonly understood by one of ordinary skill in the art to which this disclosure belongs.

As used herein, the singular forms "a," "an," and "the" include plural references unless the context clearly dictates otherwise. Any reference to "or" herein is intended to encompass "and/or" unless otherwise stated.

As used herein, the term "about" refers to an amount that is near the stated amount by about 0%, 5%, or 10%, including increments therein.

Unless otherwise defined, all technical terms used herein have the same meaning as commonly understood by one of ordinary skill in the art to which this disclosure belongs.

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

Any element in a claim that does not explicitly state "means for" performing a specified function, or "step for" performing a specified function, is not to be interpreted as a "means" or "step" clause as specified in 35 U.S.C. § 112, ¶ 6. In particular, any use of "step of" in the claims is not intended to invoke the provision of 35 U.S.C. § 112, ¶ 6.

Persons of ordinary skill in the art may appreciate that numerous design configurations may be possible to enjoy the functional benefits of the inventive systems. Thus, given the wide variety of configurations and arrangements of embodiments of the present invention the scope of the invention is reflected by the breadth of the claims below rather than narrowed by the embodiments described above.

What is claimed is:

1. A diagnostic measurement system, configured to perform an electrical test in a device under test, the diagnostic measurement system comprising:
   a power multiplexer, electrically coupled to a plurality of energy storage devices;
   a power converter circuit, electrically coupled to the power multiplexer;
   an isolated power converter circuit, with a primary side and secondary side; where the primary side is electrically coupled to a primary set member; wherein the primary set member is at least one member of a primary set consisting of: an external power source and the plurality of energy storage devices; wherein the secondary side is electrically coupled to a secondary set member; wherein the secondary set member is at least one member of a secondary set consisting of: the power converter circuit and the power multiplexer;
   a measurement circuit, electrically coupled to a measurement set member; wherein the measurement set member is at least one member of a measurement set consisting of: the power converter circuit and the plurality of energy storage devices;
   a secondary energy storage device, electrically coupled to a circuit set member; wherein the circuit set member is at least one member of a circuit set consisting of: the power converter circuit and the isolated power converter circuit;
   and
   a charge management controller, electrically coupled to the power multiplexer, the power converter circuit, and the isolated power converter circuit; wherein the charge management controller is programmed with instructions to:
   perform the electrical test;
   adjust a charge in the secondary energy storage device to a target voltage through the power multiplexer by transferring energy between the secondary energy storage device and a support device; wherein the support device is at least one member of the plurality of energy storage devices
   transfer electrical power through the power multiplexer and the power converter circuit to the device under test in order to perform the electrical test; and
   complete the electrical test.

2. The diagnostic measurement system of claim 1, wherein the measurement circuit further comprises circuitry to:
   measure or estimate a voltage of the device under test during the electrical test;
   measure or estimate a current of the device under test during the electrical test;
   compute voltage drop over time from a measured voltage signal or an estimated voltage signal;
   compute dc internal resistance of the device under test from a measured voltage or an estimated voltage and current signals; and
   compute ac impedance of the device under test from the measured voltage or the estimated voltage and the current signals.

3. The diagnostic measurement system of claim 2, wherein the measurement circuit further comprises the circuitry to:
   estimate the current or the voltage of the device under test using a reference control signal used to control the power converter circuit during the electrical test.

4. The diagnostic measurement system of claim 1, wherein the device under test is at least one energy storage device selected from the plurality of energy storage devices.

5. The diagnostic measurement system of claim 1, wherein the plurality of energy storage devices is arranged in one member of an arrangement set consisting of: a series arrangement, a parallel arrangement, and a combination of a series and parallel arrangement.

6. A multi-port power transfer circuit, configured to complete a power transfer operation selected from an operation set consisting of performing a cell balancing and performing a power transfer through a charge adjustment in a target device, the multi-port power transfer circuit comprising:
   a power multiplexer, electrically coupled to a plurality of energy storage devices;
   a power converter circuit electrically coupled to the power multiplexer;
   an isolated power converter circuit, with a primary and secondary side; where the primary side is electrically coupled to either an external power source or the plurality of energy storage devices; where the secondary side is electrically coupled to a power converter circuit or the power multiplexer;
   a secondary energy storage device, electrically coupled to the power converter circuit and/or to the isolated power converter circuit;
   a charge management controller, electrically coupled to the power multiplexer, the power converter circuit, and the isolated power converter circuit; wherein the charge management controller is programmed with instructions to:
   adjust a charge in the secondary energy storage device to a target voltage by transferring energy between the secondary energy storage device or the plurality of energy storage devices, and a support device, selected from at least one member of the plurality of energy storage devices;

transfer electrical power to the target device from the secondary energy storage device, from a plurality of energy storage devices, or from the external power source; and complete the charge adjustment when a target device voltage or a state-of-charge reaches a desired level.

7. The multi-port power transfer circuit of claim 6, wherein adjusting the charge in the secondary energy storage device to the target voltage by transferring the energy between the secondary energy storage device and at least one member of the plurality of energy storage devices through the power multiplexer further comprises charging the secondary energy storage device to a desired level of voltage or the desired level of the state-of-charge by transferring power from at least one member of the plurality of energy storage devices.

8. The multi-port power transfer circuit of claim 7, wherein adjusting the charge in the secondary energy storage device to the target voltage by transferring the energy between the secondary energy storage device and the at least one member energy storage devices through the power multiplexer further comprises discharging the secondary energy storage device to the desired level of voltage or the desired level of the state-of-charge by transferring power to at least one member of the plurality of energy storage devices.

9. The multi-port power transfer circuit of claim 8, wherein adjusting the charge in the target device includes:

charging the target device through the power multiplexer and the power converter circuit with the energy from the secondary energy storage device;

charging the target device through the power multiplexer and the isolated power converter circuit with the energy from the plurality of energy storage devices;

charging the target device through the power multiplexer, and the isolated power converter circuit, with the energy from the external power source; and charging the target device through a power combination of the power multiplexer, the power converter circuit, and the isolated power converter circuit, with the energy from either the secondary energy storage device, the plurality of energy storage devices as a group, and the external power source.

10. The multi-port power transfer circuit of claim 9, wherein adjusting the charge in the target device which includes:

discharging from the target device into the secondary energy storage device through the power multiplexer and the power converter circuit;

discharging from the target device into the plurality of energy storage devices, collectively, through the power multiplexer and the isolated power converter circuit;

discharging from the target device into the external power source through the power multiplexer, and the isolated power converter circuit; and discharging from the target device into at least one member of a first combination set consisting of the secondary energy storage device, the plurality of energy storage devices, collectively, and the external power source, through at least one member of a second combination set consisting of: the power multiplexer, the power converter circuit, and the isolated power converter circuit.

11. The multi-port power transfer circuit of claim 6, wherein the target device is at least one energy storage selected from the plurality of energy storage devices.

12. A charge management controller assembly, configured to maintain safe operation of a plurality of electrochemical energy storage devices, the charge management controller assembly further comprising:

a power multiplexer, electrically coupled to a plurality of energy storage devices;

a power converter circuit, electrically coupled to the power multiplexer and a measurement circuit;

an isolated power converter circuit, with a primary and secondary side; where the primary side is electrically coupled to either an external power source or a plurality of series cells; where the secondary side is electrically coupled to the power converter circuit or the power multiplexer;

a secondary energy storage device, electrically coupled to the power converter circuit and/or to the isolated power converter circuit; and a charge management controller, electrically coupled to the power multiplexer, the power converter circuit, and the isolated power converter circuit programmed with instructions to:

maintain a safe operation of all energy storage devices and the plurality of electrochemical energy storage devices during an electrical test; and maintain the safe operation of all energy storage devices and the plurality of electrochemical energy storage devices during balancing operation.

13. The charge management controller assembly of claim 12, wherein maintaining safe operation during the electrical test further comprises:

maintaining at least one system parameter throughout the electrical test; wherein the at least one system parameter is selected from a parameter set consisting of: a secondary energy storage device voltage, a state-of-charge below a predefined maximum voltage limit, and a maximum state-of-charge limit;

maintaining at least one additional system parameter throughout the electrical test; wherein the at least one additional system parameter is selected from an additional parameter set consisting of: the secondary energy storage device voltage, the state-of-charge above a predefined minimum voltage limit and a predefined minimum state-of-charge limit throughout the electrical test;

adjusting a charge in the secondary energy storage device through the power multiplexer by transferring energy between the secondary energy storage device and a support device, selected from at least one member of the plurality of energy storage devices; and adjusting the charge in the secondary energy storage device through the isolated power converter circuit by transferring the energy between the secondary energy storage device and one member of a destination set consisting of the plurality of energy storage devices, collectively, the secondary energy storage device, and the external power source.

14. The charge management controller of claim 13, wherein maintaining safe operation during the balancing operation further comprises:

maintaining safe at least one system parameter throughout the balancing operation; wherein the at least one system parameter is selected from a parameter set consisting of: a secondary energy storage device voltage, a state-of-charge below a predefined maximum voltage limit, and a maximum state-of-charge limit;

maintaining at least one additional system parameter throughout the balancing operation; wherein the at least one additional system parameter is selected from an additional parameter set consisting of: the secondary energy storage device voltage, the state-of-charge above a predefined minimum voltage limit and a predefined minimum state-of-charge limit throughout the electrical test;

adjusting a charge in the secondary energy storage device through the power multiplexer by transferring energy between the secondary energy storage device and a support device, selected from at least one member of the plurality of energy storage devices; and adjusting the charge in the secondary energy storage device through the isolated power converter circuit by transferring the energy between the secondary energy storage device and the plurality of energy storage devices in a group and/or between the secondary energy storage device and the external power source.

\* \* \* \* \*